US 6,538,556 B1

(12) United States Patent
Kawajiri (10) Patent No.: US 6,538,556 B1
(45) Date of Patent: Mar. 25, 2003

(54) REMOTE CONTROLLER AND CONTROLLED APPARATUS FOR IMPROVED REMOTE CONTROL SYSTEM

(75) Inventor: Momoe Kawajiri, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/459,911

(22) Filed: Dec. 14, 1999

(30) Foreign Application Priority Data

Dec. 16, 1998 (JP) .......................................... 10-357486

(51) Int. Cl.$^7$ ................................................ H04L 7/00
(52) U.S. Cl. ..................... 340/3.2; 340/3.1; 340/825.37; 340/539
(58) Field of Search ....................... 340/310.01, 310.06, 340/3.1, 3.2, 825.69, 825.57, 538, 539, 3.3, 3.31, 531, 825.37; 345/161, 172; 709/204, 205, 227

(56) References Cited

U.S. PATENT DOCUMENTS

| | | | | |
|---|---|---|---|---|
| 4,734,791 A | * | 3/1988 | Stearns et al. ................. | 386/52 |
| 4,763,104 A | * | 8/1988 | Inoue et al. ........... | 340/310.01 |
| 5,982,355 A | * | 11/1999 | Jaeger et al. ................ | 345/161 |
| 6,131,111 A | * | 10/2000 | Yoshino et al. ............. | 709/204 |

FOREIGN PATENT DOCUMENTS

| | | |
|---|---|---|
| JP | 02009300 | 1/1990 |
| JP | A-5 14976 | 1/1993 |
| JP | 05014976 | 1/1993 |
| JP | A-6225234 | 8/1994 |
| JP | 06311385 | 11/1994 |
| JP | 09187084 | 7/1997 |

* cited by examiner

Primary Examiner—Van Trieu
(74) Attorney, Agent, or Firm—Birch, Stewart, Kolasch & Birch, LLP (57) ABSTRACT

A remote control system has a remote controller and one or more controlled apparatuses, and a single operation of the remote controller by a user allows a series of functions to be continuously performed in the one or more controlled apparatuses. Upon operation of the remote controller by a user, the remote controller makes an inquiry about a current state of a controlled apparatus. In response to the inquiry from the remote controller, the apparatus sends a signal indicative of its current state. The remote controller then compares the current state of the apparatus with a desired state. The remote controller transmits a function control signal to the apparatus to instruct the apparatus to perform a required function only when the current state of the apparatus does not coincide with the desired state. The same function control signal is repeatedly transmitted until the current state of the apparatus coincides with the desired state.

12 Claims, 6 Drawing Sheets

| TITLE | NUMBER OF FUNCTIONS | KIND OF BUTTON | EQUIPMENT | FUNCTION | NEXT DESIRED STATE | ... |

1 STEP
A NUMBER OF STEPS

Fig.6

| EQUIPMENT | FUNCTION | FUNCTION FLAG | CONFIRMATION FLAG |

REMOTE CONTROLLER AND CONTROLLED APPARATUS FOR IMPROVED REMOTE CONTROL SYSTEM

BACKGROUND OF THE INVENTION

The present invention generally relates to an apparatus and method for remotely controlling apparatuses such as a television set, a video recorder, an air conditioner, etc., and particularly, to a remote controller for, with a single operation thereof by a user, consecutively outputting a plurality of function control signals to instruct the apparatuses to perform required functions. The present invention also relates to a controlled apparatus to be controlled by such a remote controller. Furthermore, the present invention relates to a remote control system consisting of such a remote controller and one or more apparatuses to be controlled by the function control signals consecutively transmitted from the remote controller.

Conventionally, there have been developed various types of remote controllers that, with a single operation thereof, make a plurality of functions to be consecutively executed in one or more controlled apparatuses. For example, Japanese Patent Laid-Open Publication No. HEI 5-14976 proposes a technique in which a plurality of one-shot signals, each for executing one function, of a remote controller are combined and, upon depression of one continuous-transmission switch by a user, the combined individual signals are sequentially output from the remote controller in a predetermined order. Japanese Patent Laid-Open Publication No. HEI 6-225234 also proposes a technique in which information on a plurality of functions is collectively stored for each series of functions and when executing a series of functions, the stored information is read and the functions are sequentially executed.

The aforementioned prior art techniques, however, have had the following problems.

In the case of a series of functions to be continuously executed by a single operation of a remote controller, the following disadvantages occur if the series of functions includes a function that is provided by a toggle switch, e.g., typically a power switch, for switching between two states with one function signal or by a rotary switch, e.g., typically an input mode switch of a television set, for sequentially changing a plurality of states from one state to another with one function signal. That is, in executing a series of functions, if a remote controller transmits such a signal without knowing the current state of an apparatus to be controlled, then the apparatus to be controlled might be switched into a state different from a desired state. For example, suppose that two functions of turning on the power of a television set and of tuning in to Channel 6 are executed in series by merely depressing the switch of Channel 6. If, however, the power has already been turned on when depressing the switch of Channel 6, a power signal transmitted to the television set according to the first function will turn off the power switch of the television set, which is a toggle switch, contrary to the user's demand. Thus, even if a signal for tuning in to Channel 6 according to the second function is then transmitted, the television set will not be tuned to Channel 6 since the television set power is already off. This means a failure in executing the series of functions.

SUMMARY OF THE INVENTION

In view of the aforementioned prior art examples, a primary object of the present invention is to provide a remote controller for controlling one or more apparatuses to reliably bring all apparatuses into their desired states when a user makes the apparatuses continuously execute a plurality of functions by a single operation of the remote controller.

Another object of the present invention is to provide an apparatus to be controlled by the remote controller, which apparatus is associated with the remote controller to reliably come into a desired state in a series-of-functions mode.

There is provided, according to a first aspect of the present invention, a remote controller for, with a single operation thereof by a user, sequentially transmitting a plurality of function control signals to one or more apparatuses to be controlled such that a series of functions are performed, comprising:

means for making an inquiry about a current state of an apparatus to be controlled;

means for comparing a response, received from the apparatus, indicative of the current state of the apparatus with a desired state; and means for transmitting a function control signal to the apparatus to instruct the apparatus to perform a required function only when the means for comparing determines that the current state of the apparatus does not coincide with the desired state.

The remote controller may have a storage which stores an information table for controlling the series of functions, wherein the information table associates each function to be performed with an apparatus to be controlled and a desired state of the apparatus. The information table may further associate each function with a kind of a switch to be operated of the apparatus.

According to the present invention, by making an inquiry about the current state of the apparatus to be controlled before transmitting a function control signal, the remote controller can determine whether or not the apparatus has already been in the desired state for accomplishment of a series of functions. If the apparatus has already been in the desired state, the function control signal is not transmitted. When the apparatus is not in the desired state, the function control signal is transmitted. In this case, if the switch to be operated of the apparatus is a toggle switch, the function control signal will be transmitted only one time. If the switch to be operated of the apparatus is a rotary switch, the function control signal may be repeatedly transmitted until the desired state is achieved. Thus, each apparatus to be controlled can be reliably brought into the desired state.

According to a second aspect of the present invention, there is provided an apparatus to be controlled by a remote controller, comprising:

means for, in response to an inquiry about a current state of the apparatus from the remote controller, checking the current state of the apparatus; and means for sending a signal indicative of the current state of the apparatus to the remote controller.

The signal indicative of the current state of the apparatus will serve as a material based on which the remote controller determines whether to transmit a function control signal to the apparatus.

The present invention further provides a remote control system comprising the remote controller according to the first aspect of the invention and one or more apparatuses to be controlled according to the second aspect of the present invention.

It is preferable that the one or each apparatus to be controlled further comprises means for, upon receipt of the inquiry from the remote controller, discriminating whether the inquiry from the remote controller is directed to the apparatus itself.

By providing a signal to be transmitted from the remote controller with a flag that represents the kind of the signal, the controlled apparatus is able to determine from the flag whether the remote controller is making an inquiry about the status of the apparatus or is instructing the apparatus to execute a function.

There is also provided, according to a further aspect, a method of remotely controlling one or more apparatuses to continuously perform a series of functions, comprising the steps of:

checking a current state of an apparatus to be controlled;

comparing the current state of the apparatus with a desired state; and transmitting a function control signal to the apparatus to instruct the apparatus to perform a required function only when the current state of the apparatus does not coincide with the desired state.

By knowing what kind of switch each function included in the series of functions is associated with, it is possible to operate each switch properly to thereby achieve the required functions even when a toggle switch and a rotary switch are involved. For this reason, before the step of checking a current state, the method may further comprise the step of deciding as to what kind of switch is to be operated in the apparatus. In this case, when a rotary switch is to be operated, the steps of checking a current state, comparing the current state and transmitting a function control signal will be repeatedly performed until the current state of the apparatus becomes coincident with the desired state. When a toggle switch is to be operated, the steps of checking a current state, comparing the current state, and transmitting a function control signal will be performed only once.

Other objects, features and advantages of the present invention will be obvious from the following description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

A preferred embodiment of the present invention will be described in detail below with reference to the accompanying drawings.

The remote controller of the present embodiment is capable of performing two-way communication, and can be used as a common remote controller for a plurality of controlled apparatuses such as an air conditioner, a television set, a video recorder and so on.

Figure 3:
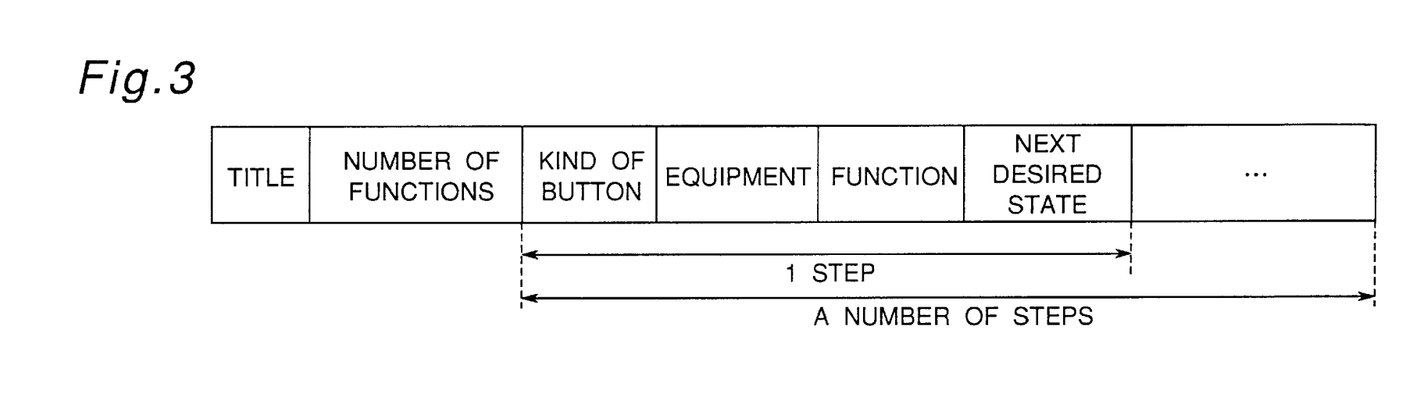
FIG. 3 is a chart generally showing an information table for controlling a series of operations according to the present invention.
Figure 7:
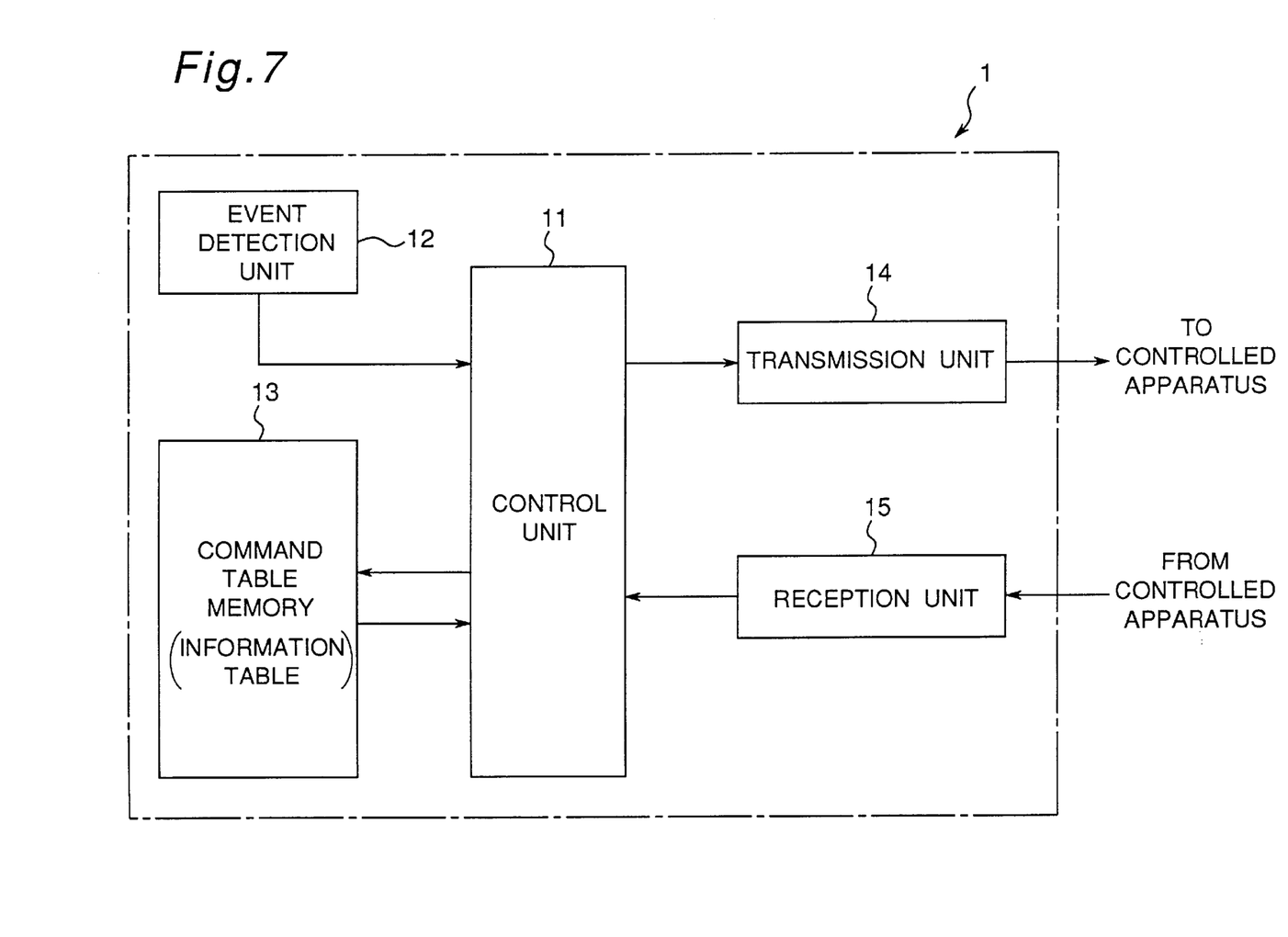
FIG. 7 is a block diagram showing a basic construction of the remote controller according to the embodiment of the present invention.

As shown in FIG. 7, the remote controller 1 has a control unit 11, an event detection unit 12 for detecting an operation of the remote controller by a user, a command table memory 13 for storing the information table for controlling a system of series of operations as shown in FIG. 3, and a transmission unit 14 and a reception unit 15 serving for the two-way communications between this remote controller 1 and one or more controlled apparatuses 2. The transmission unit 14 sends a control signal to a controlled apparatus, and the reception unit 15 receives a signal from the controlled apparatus. The transmission unit 14 and the reception unit 15 are wireless and utilize infrared rays or radio wave. When utilizing infrared rays, the transmission unit 14 includes an LED, while the reception unit 15 includes a photodiode. Upon receipt of a signal from the event detection unit 12, the control unit 11 starts a controlling processing in accordance with the flowchart shown in FIG. 1.

Figure 8:
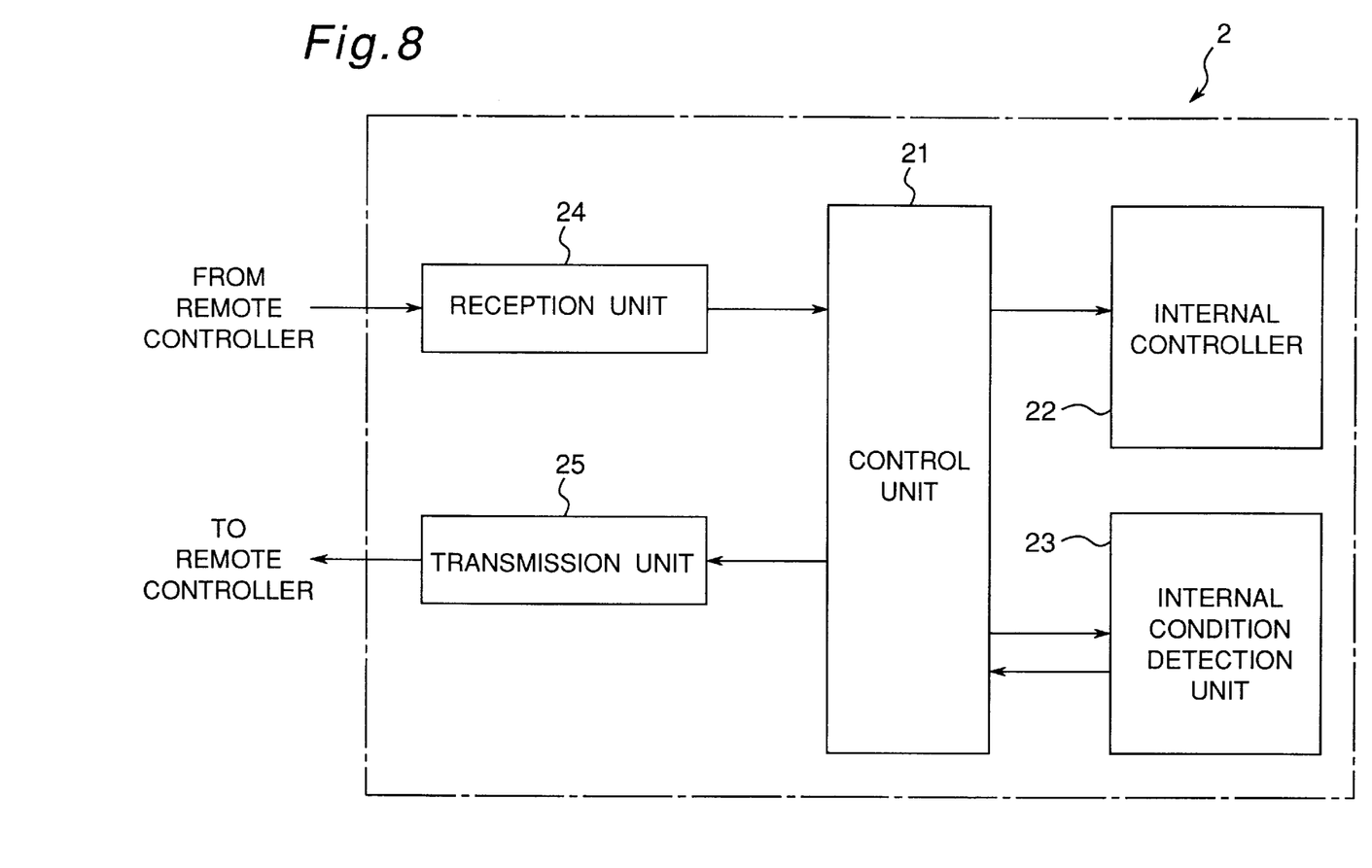
FIG. 8 is a block diagram showing a basic construction of the controlled apparatus according to the embodiment of the present invention.

On the other hand, as shown in FIG. 8, the controlled apparatus 2 according to the present embodiment has a control unit 21, an internal controller 22 for controlling the operation of the internal components of the controlled apparatus under control of the control unit 21, and an internal condition detection unit 23. The internal condition detection unit 23 checks the current internal condition or status of the apparatus 2 under control of the control unit 21 at the request of the remote controller 1, and informs the control unit 21 of the internal status. The controlled apparatus 2 also has a reception unit 24 and a transmission unit 25 to be associated with the transmission unit 14 and the reception unit 15 of the remote controller 1 for the two-way communications between this apparatus 2 and the remote controller 1. The reception unit 24 and the transmission unit 25 are wireless and utilize infrared or radio wave. When utilizing infrared, the transmission unit 25 includes an LED, while the reception unit 24 includes a photodiode, as in the controller 1. Upon receipt of a signal from the reception unit 24, the control unit 21 executes a processing shown in FIG. 2.

The remote controller 1 and one or more apparatuses 2 having the above construction constitute a remote control system.

Next, a series of operations performed in the embodiment of the present invention will be described using the following examples.

(FIRST EXAMPLE)

A series of operations for tuning a television set to Channel 6 will be described as a first example.

Figure 4:
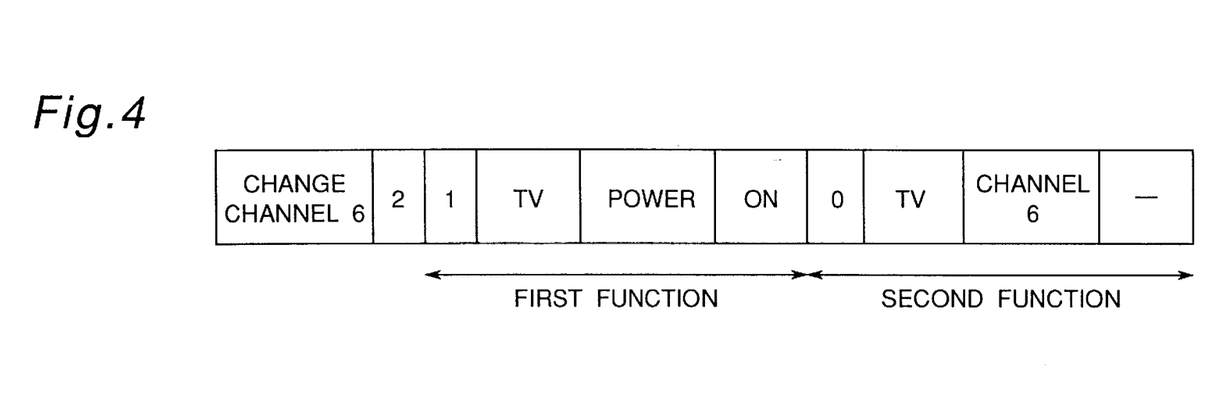
FIG. 4 shows an example of contents of the information table for controlling a series of operations in accordance with the embodiment of the present invention.

First, the processing performed on the side of the remote controller 1 under control of the control unit 11 is described with reference to FIG. 1. If a channel 6 switch on the remote controller is depressed by a user, then the remote controller reads the header of the information table corresponding to Channel 6 (S1). The header is constructed of the title and the number of functions in FIG. 3. The remote controller searches for the title corresponding to the depressed switch and reads the number of functions of the information table. The number of functions is a total number of functions to be executed as a series of functions of this title. In regard to the changing of the channel of the television set, there are totally two functions: a function of turning on the power of the television set and a function of tuning in to Channel 6, as shown in FIG. 4.

It is next determined whether or not a counter N for counting the number of functions has ended counting (S2). The counter N is incremented by one every time one function is executed. The value of the counter N is used to determine whether or not the functions to the number indicated on the information table have been executed. The coincidence of the value of the counter N with the number of functions read from the information table means that all the functions described in the information table have been executed, and the processing for the series of operations is ended.

If the counter N has not yet reached the number of functions indicated on the information table, then the counter N is incremented by one (S3). Next, information concerning a function is read from the information table (S4). In this example, information concerning the function of turning on the power of the television set is first read from the information table. Also, a confirmation flag and a function flag, which are flags indicating the kind or nature of a signal transmitted from the remote controller, are preparatorily reset to zero (S5). By transmitting the confirmation flag and the function flag together with the signal transmitted from the remote controller to the apparatus to be controlled, the apparatus to be controlled can determine whether to answer to the remote controller about the internal status of the apparatus itself or to execute a required function.

Then, it is determined of what kind the switch to realize the function read from the information table is (S6). Through this determination step, switchs are classified into three types: a rotary switch, a toggle switch and a direct switch. The direct switch is a switch for which transmission of a function signal only once brings the apparatus to be controlled into a desired state. In this example in which the channel of the television set is changed, the power switch of the television set is a toggle switch, while the channel selection switch is a direct switch. The kind of the switch is indicated in the first frame of the information table of each function in FIG. 3. In this case, number "0" represents the direct switch, number "1" represents the toggle switch and number "2" represents the rotary switch. Therefore, the kind of the switch corresponding to the power of the television set is represented by the number 1. Upon confirming the kind of the switch, the remote controller proceeds to the processing for each switch.

In the series of operations for changing the channel of the television set, the first function is to turn on the power of the television set as shown in FIG. 4, and accordingly, the program flow proceeds to the processing for the toggle switch. In the steps for the toggle switch, the confirmation flag is set to one (S13) . In the case of the toggle switch, if the remote controller transmits a control signal without knowing the internal state of the apparatus to be controlled in the series-of-functions mode, it is possible that the desired state is not achieved as a consequence of the series of operations. Therefore, a confirmation signal for inquiring the internal state of the apparatus to be controlled is first transmitted.

Subsequently, a command to confirm the internal state is transmitted to the apparatus to be controlled (S14). After completing the transmission of the command, an ACK, or reply about the internal state from the apparatus to be controlled is awaited (S15). When the ACK is received from the apparatus to be controlled (YES side of S15), it is determined whether or not the internal state of the apparatus to be controlled is in the desired state in performing the series of operations (S16). The desired state in performing the series of operations is described in the fourth frame of the information table of each function, as shown in FIG. 3. Therefore, it is determined whether or not the apparatus to be controlled is in the desired state by comparing the actual internal state received from the apparatus with the desired state described in the information table. If the state is as expected (YES side of S16), namely if the power of the television set is on in this example, then steps for transmitting the function signal are skipped and the processing concerning the toggle switch ends. If the state is not as expected (NO side of S16), or if the power of the television set is off in the example, then the program flow advances to the steps for transmitting the function signal. First, the confirmation flag that was previously set to one is set back to zero (S17). Next, the function flag is set to one (S18). Setting the confirmation flag to zero and setting the function flag to one will make the apparatus receiving the signal understand that the apparatus is not required to make a reply about its own internal state, but is required to merely execute the function. Then, a function signal is transmitted (S19). In the example, a power signal of the television set is transmitted. The processing concerning the toggle switch is thus completed, and the program flow returns to step S2.

Returning to step S2, the current count N is one and has not yet reached the total number of two of functions. Therefore, the program flow proceeds to the next step (NO side of S2). The counter N is incremented by one (S3), and the information table is read for the next function (S4). In the example, the next function is a function of selecting Channel 6 of the television set. The confirmation flag and the function flag are reset to zero (S5). Then, it is judged by what kind of switch the read function is provided (S6). Referring to FIG. 4, the channel selection switch is a direct switch (number "0"), and therefore, the program flow proceeds to the processing concerning the direct switch.

For the direct switch, only the function signal is transmitted. Therefore, the function flag is set to one (S20) and the function signal is transmitted as a command (S21). That is, a signal for changing the channel to Channel 6 is transmitted to the television set. By this operation, the processing concerning the direct switch is completed, and the program flow returns to step S2.

Returning to step S2, the current count N is now two, which is equal to the total number of two of the series of functions read from the information table, and the series of processing operations of the remote controller ends (YES side of S2). Processing for a series of operations are executed on the remote controller side in this way.

Figure 2:
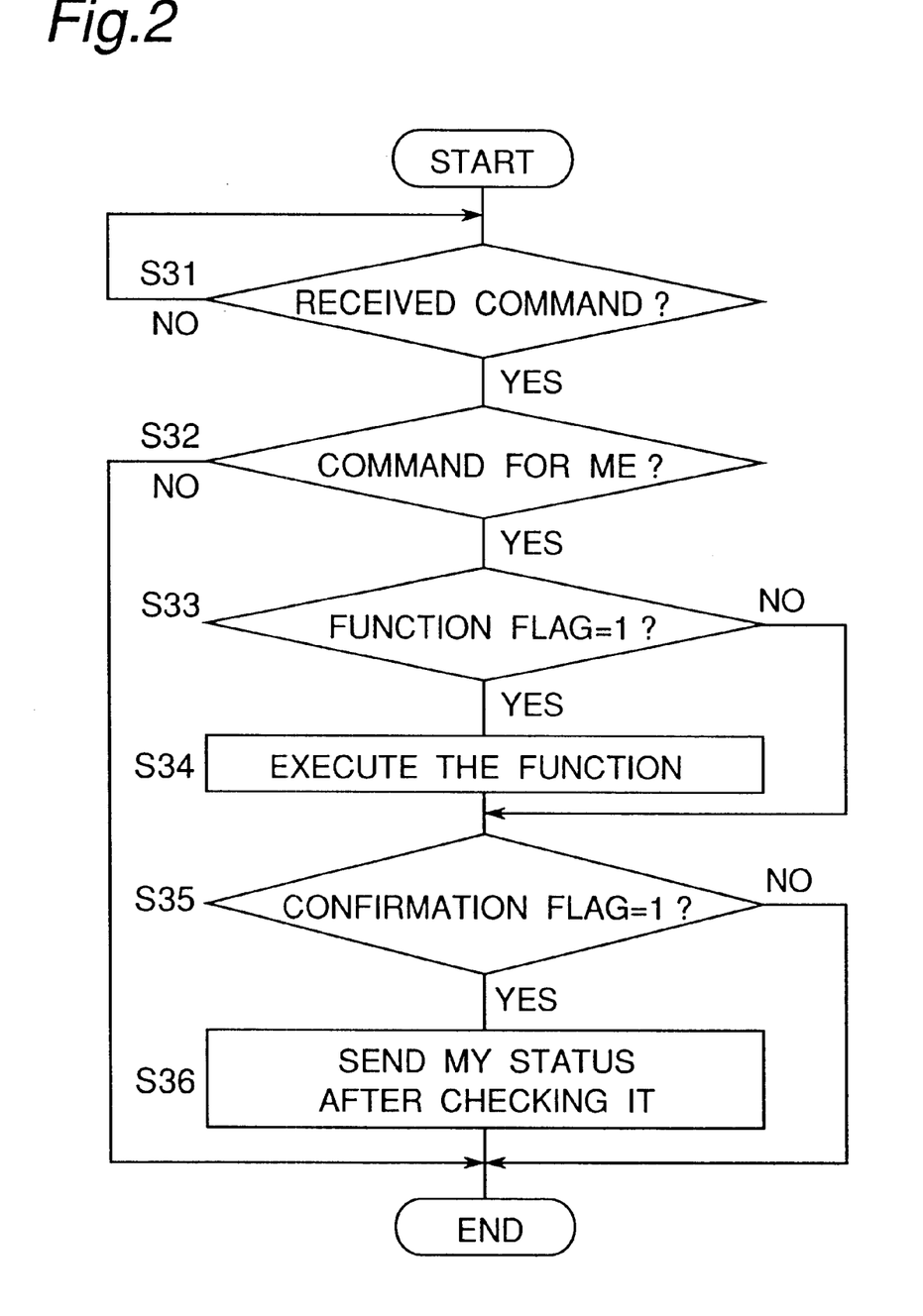
FIG. 2 is a flowchart for operating a controlled apparatus according to the present invention.
Figure 6:
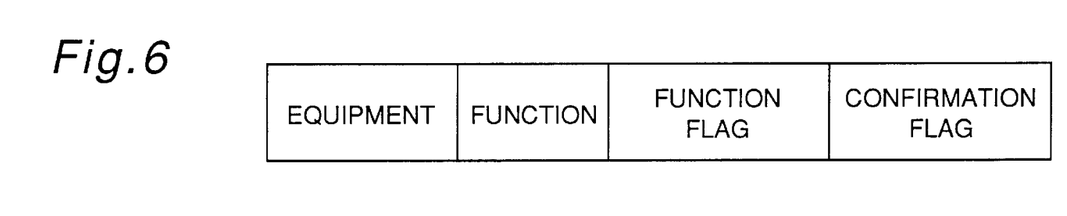
FIG. 6 is a chart showing a generalized format of a signal code transmitted from the remote controller according to the present invention.

Processing for a series of operations to be performed on the side of a controlled apparatus under control of the control unit 21 will be described next with reference to FIG. 2 that shows a flowchart of the processing and FIG. 6 that shows the generalized representation of a signal code transmitted from the remote controller.

The apparatus to be controlled first awaits a signal sent from the remote controller (S31). Then, if the signal is received (YES side of S31), the apparatus discriminates whether or not the signal is a command directed to the apparatus itself (S32). Because the signal or command that the remote controller transmits is addressed to a target equipment (a television set in this example) written in the information table, the apparatus to be controlled can determine whether or not the signal received from the remote controller is for the apparatus itself. If the signal, or command, is not for the apparatus (NO side of S32), then the signal received is ignored and the processing on this apparatus ends. If the signal is directed to the apparatus (YES side of S32), then it is determined whether or not the function flag accompanying the signal has been set to one (S33). If the function flag has been set to one (YES side of S33), then the apparatus executes the function according to the signal received from the remote controller (S34). If the function flag has not been set to one (NO side of S33), then the step of executing the function is skipped.

Thereafter, it is further determined whether or not the confirmation flag has been set to one (S35). If the confirmation flag has been set to one (YES side of S35), then the apparatus to be controlled checks its own internal status and sends the internal status to the remote controller (S36). In this example, because the television set, which is a target of control, receives a confirmation signal requiring confirmation about the status of the power of the television set, the television set checks whether its own power is on or off and makes a reply to the confirmation signal by sending the on or off status of the power to the remote controller. If the confirmation flag has not been set to one (NO side of S35), then the step of checking the status to make a reply to the confirmation signal is skipped. The processing for the series of operations of the apparatus to be controlled is executed in this way.

(SECOND EXAMPLE)

A series of operations for video playback will be described next with reference to FIGS. 1–3 and FIGS. 5–6.

Figure 5:
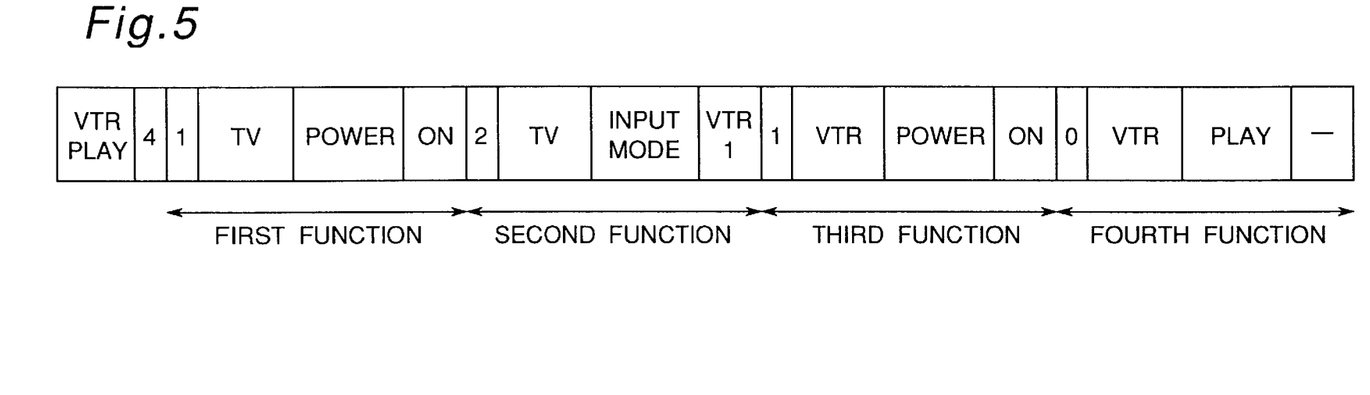
FIG. 5 shows another example of contents of the information table for controlling a series of operations.

FIG. 5 shows contents of an information table for controlling the series of operations for video playback.

In the second example, a television set and a video recorder are the targets of control.

The series of operations for video playback comprise the following four functions. First, the power of the television set is turned on. Second, the input mode of the television set is set to Video 1. Third, the power of the video recorder (VTR) is turned on. Fourth, the video recorder is made to play. As indicated on the information table shown in FIG. 5, the power switch of the television set associated with the first function is constructed of a toggle switch. The input mode switch associated with the second function is constructed of a rotary switch. The power switch of the video recorder associated with the third function is constructed of a toggle switch. The video play switch associated with the fourth function is constructed of a direct switch.

The processings concerning the toggle switchs (i.e., the power switches) and the direct switch (i.e., the video play switch) are same as described above in connection with the first example. Therefore, only a processing concerning the rotary-switch-associated function of switching the input mode of the television set is described hereinbelow.

Referring now to FIG. 1 again, discrimination about the kind of the switch, or classification of the switch, is executed at step S6. In this stage, the input mode switch of the television set is a rotary switch, and accordingly, the program flow proceeds to the steps for the rotary switch.

In the processing for the rotary switch, the confirmation flag is first set to one (S7). The reason for it is as follows. The rotary switch has a plurality of states, and is sequentially switched from one state to another each time the switch is operated. Therefore, if the function signal is transmitted blindly, then the state of Video 2 might be set, which is not the desired state. Therefore, in order to transmit the confirmation signal for inquiring the internal state of the apparatus to be controlled, the confirmation flag is first set.

Next, the confirmation signal is sent (S8). In this case, the remote controller transmits the confirmation signal in which only the confirmation flag is hoisted, or set to one, according to the signal format of FIG. 6. Then, the remote controller awaits ACK from the apparatus to be controlled (S9). If ACK is received (YES side of S9), then it is determined whether or not the state of the apparatus to be controlled is as expected (S10). The desired state is described in the information table read from the storage section. Therefore, it is determined whether or not the apparatus to be controlled is in the desired state by comparing the actual internal state received from the apparatus with the desired state described in the information table.

If both states coincide with each other (YES side of S10), namely if the input of the television set is Video 1 in the example, then there is no need for transmitting the function signal. Therefore, the processing concerning the rotary switch ends. If there is no coincidence between the states (NO side of S10), namely if the input of the television set is Video 2, then the function flag is hoisted, or set to one (S11). Then, the function signal is sent (S12). This function signal is transmitted with both the confirmation flag and the function flag hoisted. Therefore, if the apparatus to be controlled is the television set, the apparatus executes the television input mode switching function in step S34 of FIG. 2. Thereafter, since the confirmation flag has been set to one (YES side of S35), the program flow proceeds to step S36 to check the internal status of the apparatus and send the same to the remote controller.

Figure 1:
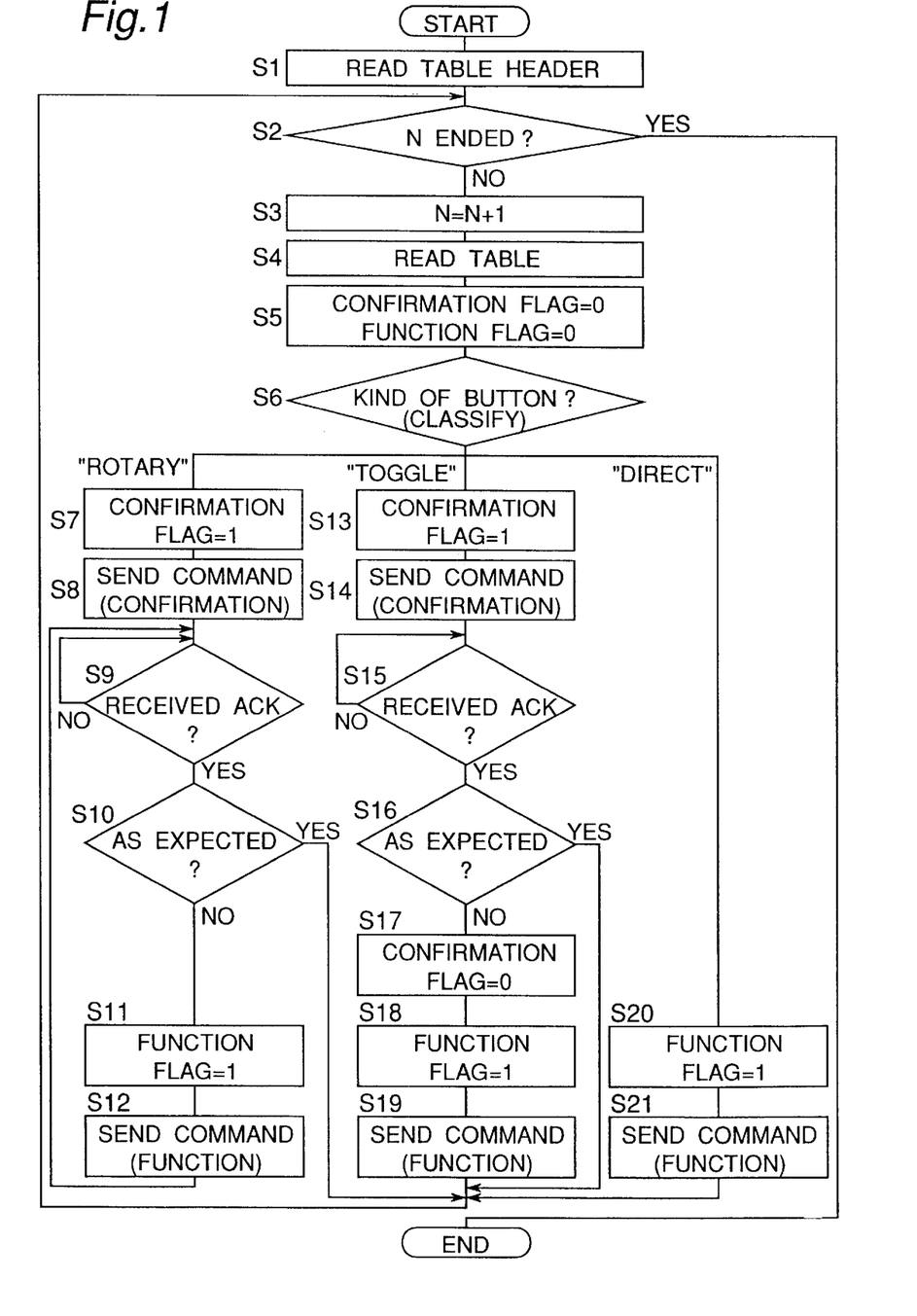
FIG. 1 is a flowchart for operating a remote controller according to the present invention.

On the remote controller side, as shown in FIG. 1, after sending the signal having both the confirmation flag and the function flag hoisted (S12), the program flow returns to step S9 to await a reply to the inquiry about the status from the apparatus to be controlled. If ACK is received from the apparatus to be controlled, then it is discriminated whether or not the current state of the apparatus to be controlled coincides with the desired state (S10). If there is no coincidence, the function flag is set to one (S11) and the function signal having both the function flag and the confirmation flag hoisted is sent (S12). The loop consisting of steps S9–S12 for the state confirmation and the function signal transmission will be repeated until the apparatus to be controlled comes into the desired state. The processing concerning the rotary switch ends when the current state of the apparatus to be controlled coincides with the desired state (YES side of S10), namely when the television input comes into the state of Video 1 in the example. The processing of the rotary switch is executed in this way.

The invention being thus described, it will be obvious that the same may be varied in many ways. Such variations are not to be regarded as a departure from the spirit and scope of. the invention, and all such modifications as would be obvious to one skilled in the art are intended to be included within the scope of the following claims.

What is claimed is:

1. A remote controller for, with a single operation thereof by a user, sequentially transmitting a plurality of function control signals to one or more apparatuses to be controlled such that a series of functions are performed, comprising:

means for making an inquiry about a current state of an apparatus to be controlled;

means for comparing a response, received from the apparatus, indicative of the current state of the apparatus with a desired state;

means for transmitting a function control signal to the apparatus to instruct the apparatus to perform a required function only when the means for comparing determines that the current state of the apparatus does not coincide with the desired state; and wherein the means for transmitting repeatedly transmits the same function control signal until the current state of the apparatus becomes coincident with the desired state.

2. The remote controller as set forth in claim 1, further comprising a storage which stores an information table for controlling the series of functions, wherein said information table associates each function to be performed with an apparatus to be controlled and a desired state of the apparatus.

3. The remote controller as set forth in claim 2, wherein said information table further associates each function with a type of switch to be operated located on the apparatus.

4. The remote controller as set forth in claim 3, wherein the switch to be operated comprises a toggle switch, a rotary switch or a direct switch.

5. An apparatus to be controlled by a remote controller, comprising, means for, in response to an inquiry about a current state of the apparatus from the remote controller, checking the current state of the apparatus;

means for sending a signal indicative of the current state of the apparatus to the remote controller; and means for, upon receipt of the inquiry from the remote controller, discriminating whether the inquiry from the remote controller is directed to the apparatus itself.

6. A remote control system comprising a remote controller and one or more apparatuses to be controlled by the remote controller, wherein a single operation of the remote controller allows a series of functions to be performed in said one or more apparatuses, said remote controller comprising:

means for making an inquiry about a current state of an apparatus to be controlled;

means for comparing a response, received from the apparatus, indicative of the current state of the apparatus with a desired state; and means for transmitting a function control signal to the apparatus to instruct the apparatus to perform a required function only when the means for comparing determines that the current state of the apparatus does not coincide with the desired state, wherein said means for transmitting repeatedly transmits the same function control signal until the current state of the apparatus gets coincident with the desired state; and said one or each apparatus to be controlled comprising:

means for, in response to an inquiry about a current state of the apparatus from the remote controller, checking the current state of the apparatus; and means for sending a signal indicative of the current state of the apparatus to the remote controller.

7. The remote control system as set forth in claim 6, wherein said remote controller further comprises a storage which stores an information table for controlling the series of functions, and this information table associates each function to be performed with an apparatus to be controlled and a desired state of the apparatus.

8. The remote control system as set forth in claim 7, wherein said information table further associates each function with a kind of a switch to be operated of the apparatus.

9. The remote control system as set forth in claim 8, wherein the switch to be operated is one of a toggle switch, a rotary switch and a direct switch.

10. The remote control system as set forth in claim 6, wherein said one or each apparatus further comprises means for, upon receipt of the inquiry from the remote controller, discriminating whether the inquiry from the remote controller is directed to the apparatus itself.

11. A method of remotely controlling one or more apparatuses to continuously perform a series of functions, comprising the steps of:

checking a current state of an apparatus to be controlled;

comparing the current state of the apparatus with a desired state;

transmitting a function control signal to the apparatus to instruct the apparatus to perform a required function only when the current state of the apparatus does not coincide with the desired state; and before said step of checking a current state, deciding as to what kind of switch is to be operated in the apparatus, and wherein when a switch is to be operated, repeatedly performing said steps of checking a current state, comparing the current state, and transmitting a function signal until the current state of the apparatus becomes coincident with the desired state.

12. A remote controller for, with a single operation thereof by a user, sequentially transmitting a plurality of function control signals to one or more apparatuses to be controlled such that a series of functions are performed, comprising:

means for making an inquiry about a current state of an apparatus to be controlled;

means for comparing a response, received from the apparatus, indicative of the current state of the apparatus with a desired state;

means for transmitting a function control signal to the apparatus to instruct the apparatus to perform a required function only when the means for comparing determines that the current state of the apparatus does not coincide with the desired state, and wherein the means for transmitting repeatedly transmits the same function control signal until the current state of the apparatus becomes coincident with the desired state, wherein each function is associated with a function switch located on the apparatus, said function switch comprising a toggle switch, a rotary switch or a direct switch.

* * * * *